United States Patent
Swier et al.

(10) Patent No.: US 8,226,212 B2
(45) Date of Patent: Jul. 24, 2012

(54) FLEXIBLE CIRCUIT FOR FLUID-JET PRECISION-DISPENSING DEVICE CARTRIDGE ASSEMBLY

(75) Inventors: Wayne K. Swier, Eugene, OR (US); Jay Holavarri, Corvallis, OR (US); John L. Taylor, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 234 days.

(21) Appl. No.: 12/866,896

(22) PCT Filed: Mar. 1, 2008

(86) PCT No.: PCT/US2008/055577
§ 371 (c)(1),
(2), (4) Date: Aug. 10, 2010

(87) PCT Pub. No.: WO2009/110881
PCT Pub. Date: Sep. 11, 2009

(65) Prior Publication Data
US 2010/0328377 A1 Dec. 30, 2010

(51) Int. Cl.
*B41J 2/14* (2006.01)
(52) U.S. Cl. .......................................... 347/50
(58) Field of Classification Search ............... 347/9, 50, 347/86
See application file for complete search history.

(56) References Cited

U.S. PATENT DOCUMENTS

| | | | |
|---|---|---|---|
| 6,241,340 | B1 | 6/2001 | Watanabe et al. |
| 6,364,475 | B2 | 4/2002 | Feinn et al. |
| 7,137,690 | B2 | 11/2006 | Kawamura et al. |
| 2002/0030715 | A1 | 3/2002 | Takata et al. |
| 2003/0043236 | A1 | 3/2003 | Mizutani |
| 2004/0032468 | A1 | 2/2004 | Killmeier et al. |
| 2007/0227768 | A1 | 10/2007 | Shin |
| 2007/0263053 | A1 | 11/2007 | Imai |

FOREIGN PATENT DOCUMENTS

| | | |
|---|---|---|
| EP | 0832747 | 4/1998 |
| EP | 1362703 | 11/2003 |
| JP | 2003266687 | 9/2003 |

OTHER PUBLICATIONS

Supplementary European Search Report for Application No. EP08731188.2. Report issued Mar. 1, 2011.

*Primary Examiner* — An Do

(57) ABSTRACT

A fluid-jet precision-dispensing device cartridge assembly includes a housing, a fluid-jet precision-dispensing device die, and a flexible circuit. The housing has a first surface and a second surface. The second surface is non-parallel to the first surface. The housing is insertable in a fluid-jet precision-dispensing device. The die is disposed at the first surface of the housing. The circuit is attached to the housing and wraps around the housing from the first surface to the second surface. The circuit includes electrically conductive traces and contacts that are electrically coupled to the die to transmit power and communicate signals between the device and the die. The circuit includes one or more regions having no functionality in usage of the assembly to precisely dispense fluid. The regions are rigid and/or thermally conductive to improve attachment of the circuit to the housing.

20 Claims, 9 Drawing Sheets

FLEXIBLE CIRCUIT FOR FLUID-JET PRECISION-DISPENSING DEVICE CARTRIDGE ASSEMBLY

BACKGROUND

A common way to form images on media, such as paper, is to use a fluid-ejection device, such as an inkjet-printing device. An inkjet-printing device has a number of inkjet-printing mechanisms, such as inkjet printhead assemblies. Each inkjet printhead assembly has a printhead die having a number of inkjet nozzles that eject ink, such as differently colored ink, in such a way as to form a desired image on the media.

So that the inkjet-printing device is able to control ink ejection from the inkjet printhead assemblies, each inkjet printhead assembly typically includes a flexible circuit connected to the printhead die of the assembly. When an inkjet printhead assembly is inserted into the inkjet-printing device, an electrical connection is made between the printhead die and the device via the flexible circuit. Ensuring that the flexible circuit is fixably attached to the inkjet printhead assembly is thus important.

DETAILED DESCRIPTION

Figure 1:
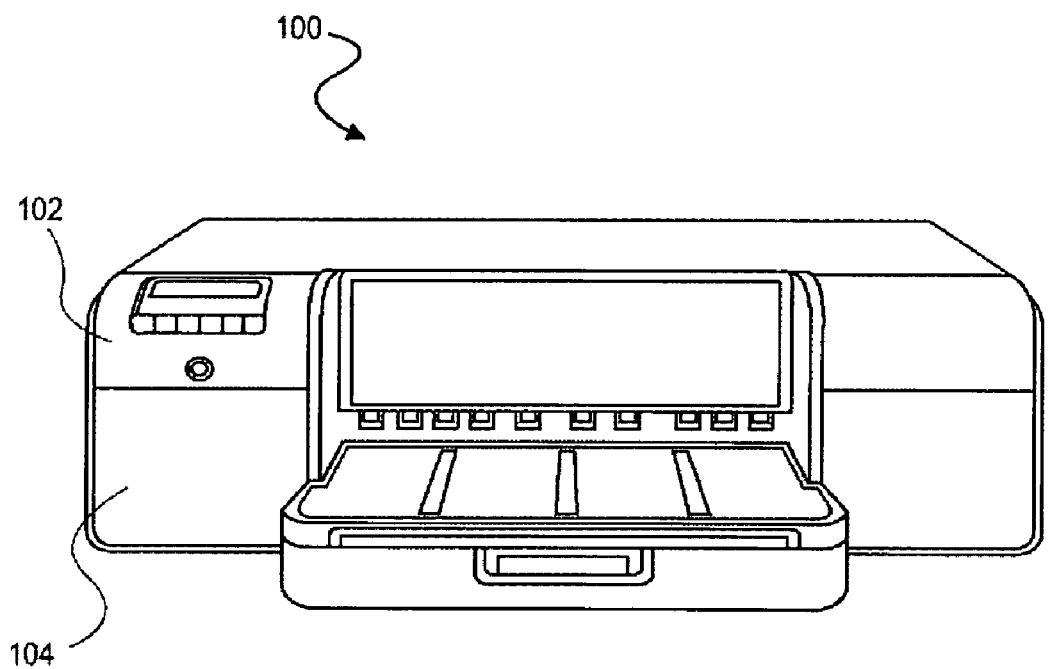
FIG. 1 is a diagram of a representative inkjet-printing device, according to an embodiment of the present disclosure.

FIG. 1 shows a representative inkjet-printing device 100, according to an embodiment of the present disclosure. The inkjet-printing device 100 is a device, such as a printer, that ejects ink onto media, such as paper, to form images, which can include text, on the media. The inkjet-printing device 100 is more generally a fluid-jet precision-dispensing device that precisely dispenses fluid, such as ink, as is described in more detail later in the detailed description.

The inkjet-printing device 100 may eject pigment-based ink, dye-based ink, or another type of ink. Differences between pigment-based inks and dye-based inks include that the former is generally more viscous than the latter, among other differences. The inkjet-printing device 100 includes at least two access doors: an access door 102, and an access door 104. The access door 104 is opened to permit a user to remove and insert ink cartridges into and from the inkjet printing device 100. The access door 102 is opened to permit a user to remove and insert inkjet printheads into and from the inkjet printing device 100.

While the detailed description is at least substantially presented herein to inkjet-printing devices that eject ink onto media, those of ordinary skill within the art can appreciate that embodiments of the present disclosure are more generally not so limited. In general, embodiments of the present disclosure pertain to any type of fluid-jet precision-dispensing device that dispenses a substantially liquid fluid. A fluid-jet precision-dispensing device is a drop-on-demand device in which printing, or dispensing, of the substantially liquid fluid in question is achieved by precisely printing or dispensing in accurately specified locations, with or without making a particular image on that which is being printed or dispensed on. As such, a fluid-jet precision-dispensing device is in comparison to a continuous precision-dispensing device, in which a substantially liquid fluid is continuously dispensed therefrom. An example of a continuous precision-dispensing device is a continuous inkjet-printing device, for instance.

The fluid-jet precision-dispensing device precisely prints or dispenses a substantially liquid fluid in that the latter is not substantially or primarily composed of gases such as air. Examples of such substantially liquid fluids include inks in the case of inkjet-printing devices. Other examples of substantially liquid fluids include drugs, cellular products, organisms, fuel, and so on, which are not substantially or primarily composed of gases such as air and other types of gases, as can be appreciated by those of ordinary skill within the art. Therefore, while the following detailed description is described in relation to an inkjet-printing device that ejects ink onto media, those of ordinary skill within the art will appreciate that embodiments of the present disclosure more generally pertain to any type of fluid-jet precision-dispensing device that dispenses a substantially liquid fluid as has been described in this paragraph and the preceding paragraph.

Figure 2A:
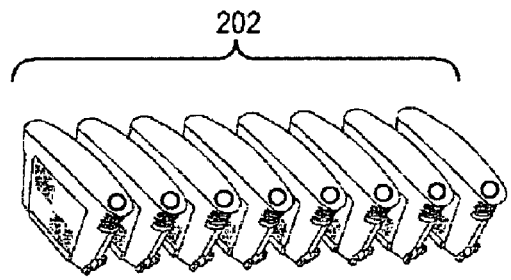
FIGS. 2A and 2B are diagrams of inkjet cartridges and how they are inserted into an inkjet-printing device, according to an embodiment of the present disclosure.

FIG. 2A shows a number of ink cartridges 202 that may be inserted into the inkjet-printing device 100, according to an embodiment of the present disclosure. In one embodiment, there may be eight such ink cartridges 202. These ink cartridges 202 may include photo black pigment-based ink cartridge, a light gray pigment-based ink cartridge, and a matte black pigment-based ink cartridge. These ink cartridges 202 may further include a cyan pigment-based ink cartridge, a magenta pigment-based ink cartridge, a yellow pigment-based ink cartridge, a light magenta pigment-based ink cartridge, and a light cyan pigment-based ink cartridge. Having eight such ink cartridges 202 enables the inkjet-printing device 100 to print photorealistic full-color images on media.

In another embodiment, however, there may be just four ink cartridges 202. The ink cartridges 202 in this embodiment may include black, cyan, magenta, and yellow ink cartridges. Having four such ink cartridges enables the inkjet-printing device 100 to print full-color images on media, but generally not as photorealistic as when there are eight ink cartridges 202. In still another embodiment, there may be just a single black ink cartridge 202. In this embodiment, the inkjet-printing device 100 can print black-and-white and grayscale images on media, but not color images.

Figure 2B:
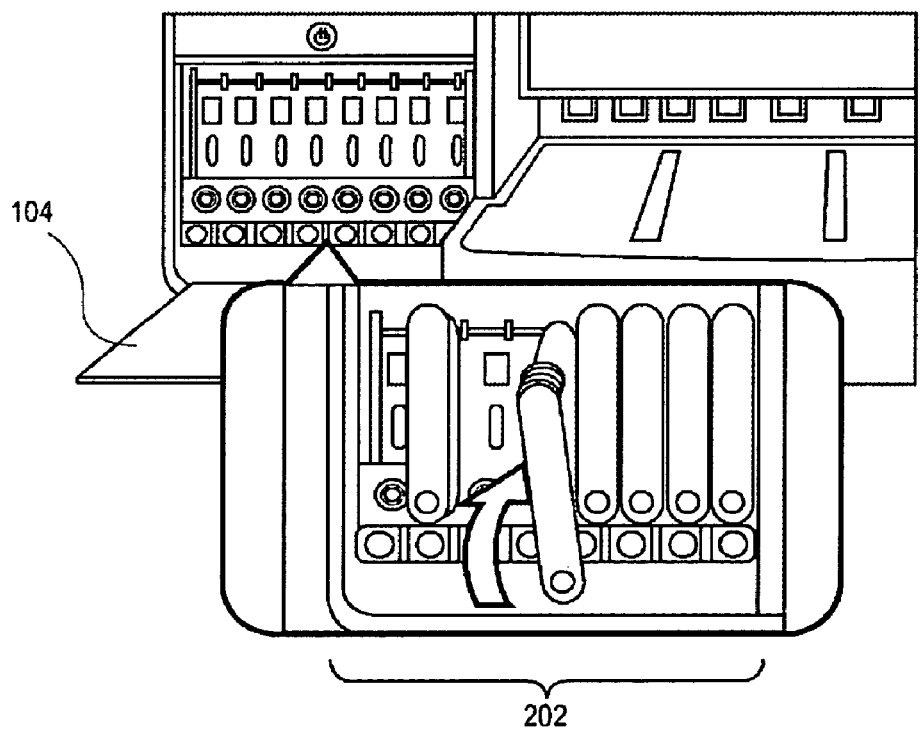

FIG. 2B shows how the ink cartridges 202 may be inserted into the inkjet-printing device 100, according to an embodiment of the present disclosure. The access door 104 is opened downwards. Opening the access door 104 reveals a number of slots. The ink cartridges 202 can be inserted into and removed from these slots of the inkjet-printing device 100. The ink cartridges 202 supply the differently colored ink by which the inkjet-printing device 100 forms images on media. The inkjet cartridges 202 are more generally fluid supplies, such as supplies of ink.

Figure 3A:
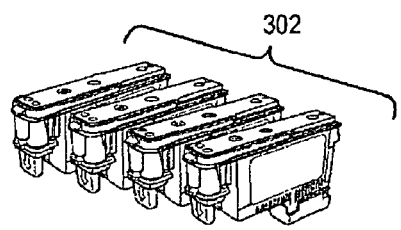
FIGS. 3A and 3B are diagrams of inkjet printheads and how they are inserted into an inkjet-printing device, according to an embodiment of the present disclosure.

FIG. 3A shows a number of inkjet printheads 302 that may be inserted into the inkjet-printing device 100, according to an embodiment of the present disclosure. The inkjet printheads 302 are more generally fluid-ejection mechanisms, in that they are the actual mechanisms that eject fluid, such as ink, onto media to form images on the media. The inkjet printheads 302 may also be referred to as inkjet printing device printhead assemblies, or just inkjet printhead assemblies. There may be four such inkjet printheads 302 in one embodiment of the present disclosure. One inkjet printhead may be responsible for ejecting photo black and light gray ink. Another inkjet printhead may be responsible for ejecting matte black and cyan ink. A third inkjet printhead may be responsible for ejecting magenta and yellow ink. The last inkjet printhead may be responsible for ejecting light magenta and light cyan ink.

In another embodiment, however, there may be just two inkjet printheads 302, in the case where there are just four differently colored inks, cyan, magenta, yellow, and black. One of these inkjet printheads may be responsible for ejecting black ink, whereas the other printhead may be responsible for ejecting cyan, magenta, and yellow ink. In still another embodiment, there may be just a single inkjet printhead, in the case where there is just black ink, such that the single inkjet printhead ejects this black ink.

Figure 3B:
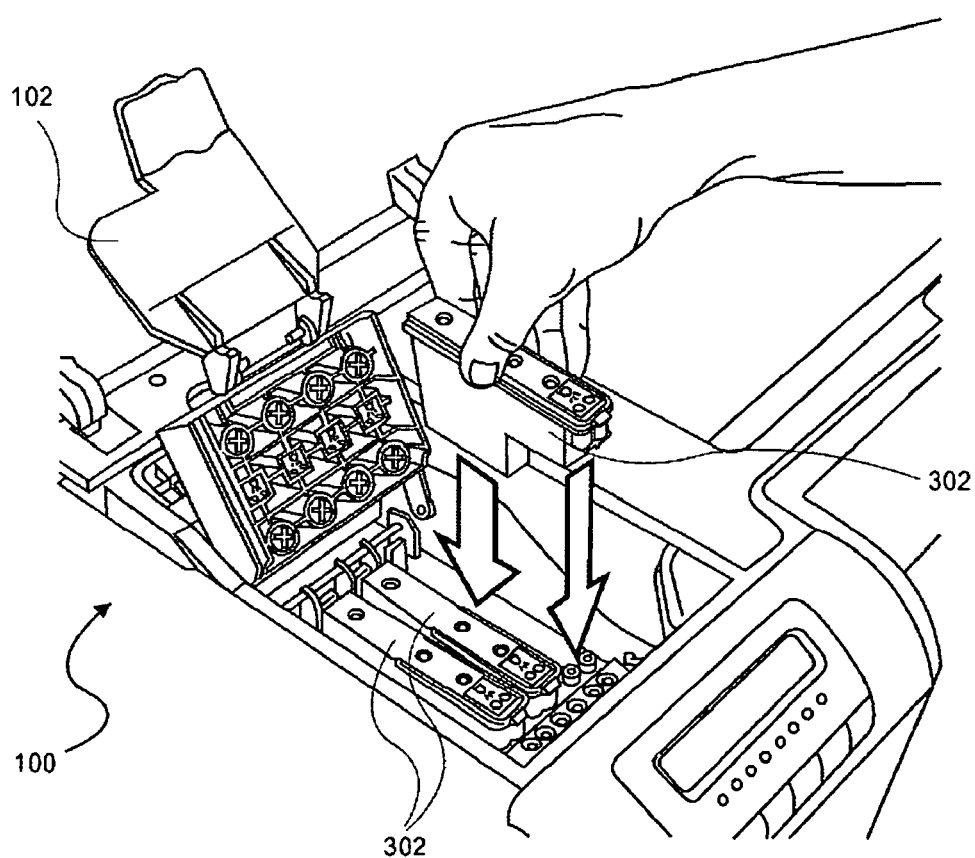

FIG. 3B shows how the inkjet printheads 302 may be inserted into the inkjet-printing device 100, according to an embodiment of the present disclosure. The access door 102 is opened upwards. Opening the access door 102 reveals a number of slots. The inkjet printheads 302 can be inserted into and removed from these slots of the inkjet-printing device 100. The inkjet printheads 302 thus eject the ink supplied by the ink cartridges 202 to form images on media.

The embodiments of the present disclosure that have been described in relation to FIGS. 2A, 2B, 3A, and 3B employ ink supplies—the ink cartridges 202—that are separate from the inkjet printheads 302. However, in another embodiment, the inkjet cartridges 202 may be integrated within the inkjet printheads 302. That is, the inkjet printheads 302 may themselves include supplies of ink, such that there are no separate inkjet cartridges 202 per se to be inserted into and removed from the inkjet-printing device 100.

Figure 4:
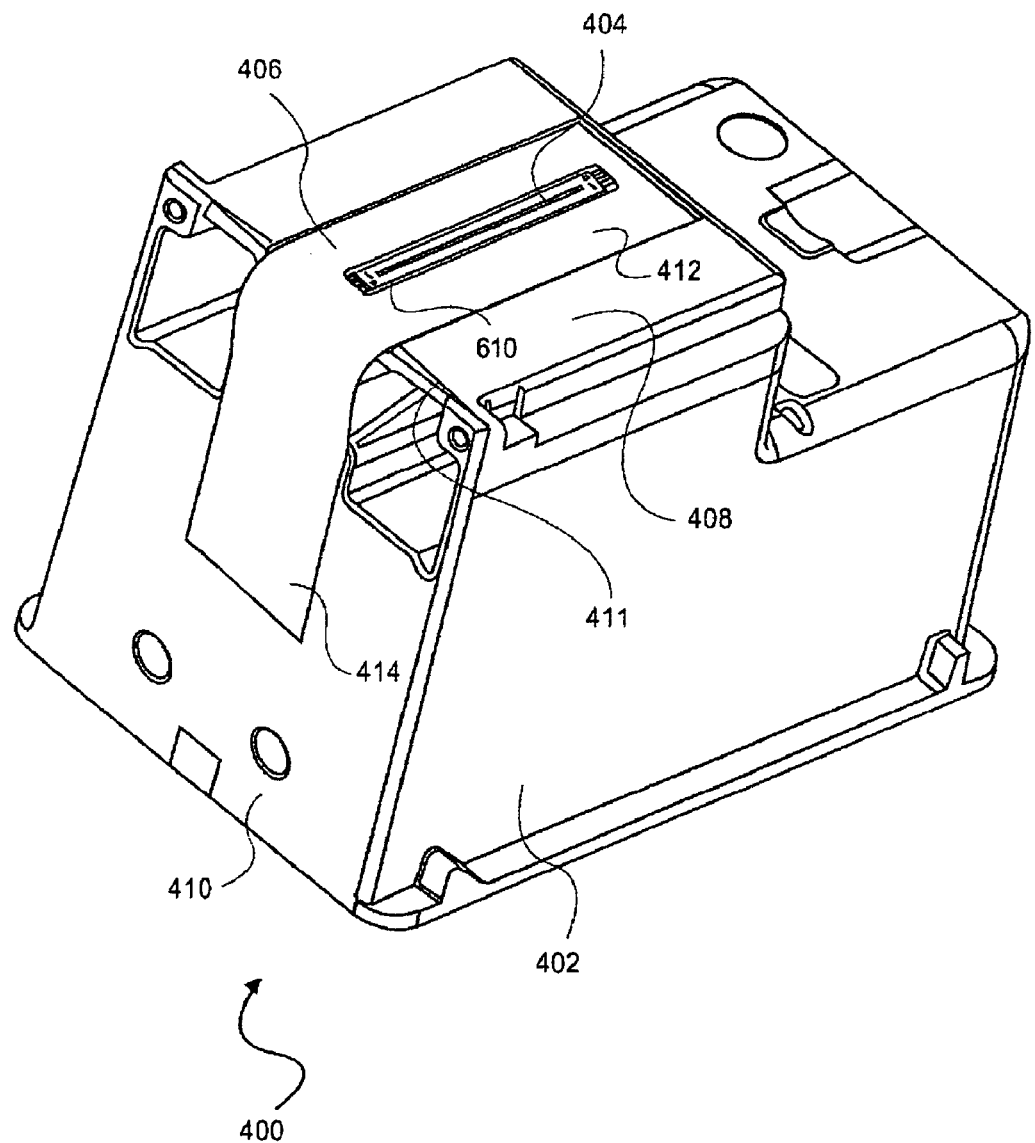
FIG. 4 is a diagram of the inkjet printhead having a flexible circuit, according to an embodiment of the present disclosure.

FIG. 4 shows a detailed view of an inkjet printhead 400, according to an embodiment of the present disclosure. The inkjet printhead 400 exemplifies each of the inkjet printheads 302 that have been described. The inkjet printhead 400 is more generally a cartridge or a cartridge assembly, and most generally a fluid-jet precision-dispensing device cartridge assembly. The inkjet printhead 400 is depicted in FIG. 4 as including a housing 402, a printhead die 404, and a flexible circuit 406. The printhead die 404 is more generally a fluid-jet precision-dispensing device die. Those of ordinary skill within the art can appreciate that the inkjet printhead 400 may include other components in addition to those depicted in FIG. 4.

The housing 402 has a first surface 408 and a second surface 410. The first surface 408 meets the second surface 410 at an edge 411 of the housing 402. The second surface 410 is non-parallel to the first surface 408. For instance, the second surface 410 may be at a right angle to the first surface 408.

The printhead die 404 is attached or otherwise disposed at the first surface 408 of the housing 402. The printhead die 404 includes a number of inkjet nozzles that eject ink, such as differently colored ink. The inkjet nozzles of the printhead die 404 are not particularly called out in FIG. 4.

The flexible circuit 406 includes a first portion 412 corresponding to the first surface 408 of the housing 402, and a second portion 414 corresponding to the second surface 410 of the housing 402. The flexible circuit 406 bends at the edge 411 of the housing 402. As such, the flexible circuit 406 is wrapped around the housing 402 from the first surface 408 to the second surface 410.

The first portion 412 of the flexible circuit 406 is attached to the first surface 408 of the housing 402, and is electrically coupled to the printhead die 404 at ends of the die 404 on the first surface 408. The second portion 414 of the flexible circuit 406 is attached to the second surface 410 of the housing 402. Upon insertion of the housing 402 of the inkjet printhead 400 into an inkjet printing device, the second portion 414 of the flexible circuit 406 makes electrical contact with the inkjet printing device. In this way, the flexible circuit 406 electrically couples the inkjet printing device with the printhead die 404 so that the printing device is able to control ejection of ink from the die 404.

Figure 5A:
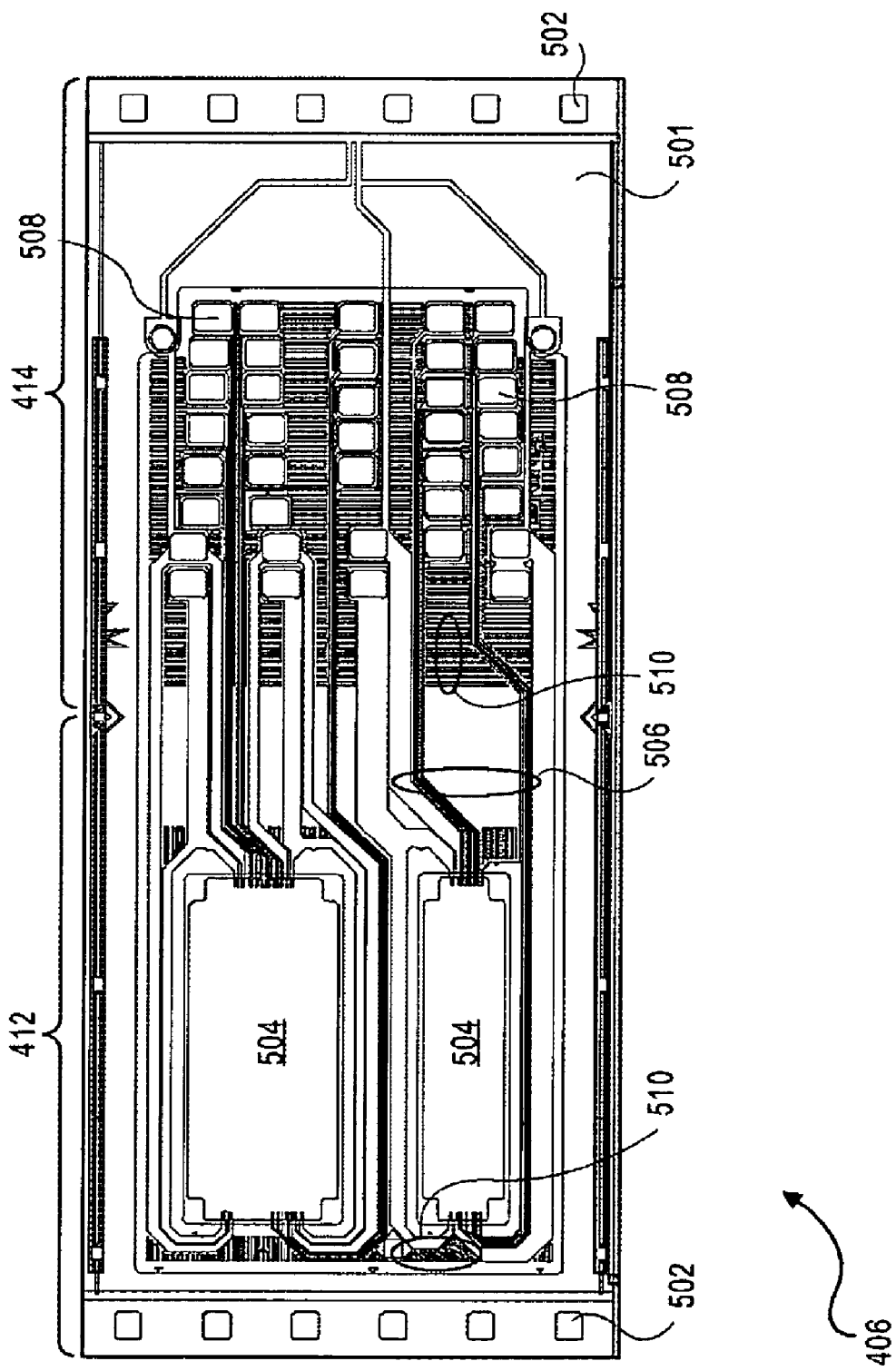
FIG. 5A is a diagram of a flexible circuit for an inkjet printhead, according to an embodiment of the present disclosure.

FIG. 5A shows flexible circuit 406 in more detail, according to an embodiment of the present disclosure. The flexible circuit 406 includes a flexible electrically non-conductive layer 501. The layer 501 may be fabricated from one or more layers of a polymer, such as polyimide, and/or another type of material. The layer 501 includes or otherwise defines the first portion 412 and the second portion 414 that have been described. In one embodiment, at either end of the layer 501 are situated a number of alignment holes, representatively depicted as the alignment holes 502 in FIG. 5A. The alignment holes 502 can be used to move the flexible circuit 406 from one reel to another throughout the fabrication process, as can be appreciated by those of ordinary skill within the art.

The layer 501 of the flexible circuit 406 includes one or more holes 504 at the first portion 412 thereof. The holes 504 correspond to the printhead dies 404 of the inkjet printhead 400, to expose the printhead dies 404. Two such holes 504 are depicted in FIG. 5A, meaning that the corresponding inkjet printhead 400 includes two printhead dies 404. However, the inkjet printhead 400 exemplarily depicted in FIG. 4 has just one printhead die 404, such that the flexible circuit 406 in the embodiment of FIG. 4 would have just one hole 504.

The layer 501 of the flexible circuit 406 also includes a number of electrically conductive traces, representatively depicted as the traces 506 in FIG. 5A, and a number of electrically conductive contacts, representative depicted as the contacts 508 in FIG. 5A. The traces 506 are disposed at the layer 501 and extend between both the portions 412 and 414 of the layer 501. By comparison, the contacts 508 are disposed at the second portion 414 of the layer 501. The traces and the contacts 508 may be fabricated from copper, another type of metal, and/or another type of electrically conductive material.

The traces 506 and the contacts 508 electrically couple the printhead die 404 of the inkjet printhead 400 to the inkjet printing device within which the printhead 400 is inserted. As such, the traces 506 and the contacts 508 transmit power and communicate signals between the inkjet printing device and the printhead die 404. The contacts 508 in particular make electrical contact with the inkjet printing device when the inkjet printhead 400 is inserted into the device.

The layer 501 of the flexible circuit 406 further includes one or more regions, representatively depicted as the regions 510 in FIG. 5A. The regions 510 are primarily disposed at the second portion 414 of the layer 501, but some of the regions 510 may be disposed at the first portion 414 of the layer 501. The regions 510 are rigid and/or thermally conductive, to improve attachment of the flexible circuit to the flexible circuit 406 to the housing 402, as will be described in more detail later in the detailed description. The regions 510 are rigid in that they are more rigid than the layer 501 of the flexible circuit 406 is, where by comparison the layer 501 is flexible to impart the circuit 406 with flexibility. The regions 510 are thermally conductive in that they are more thermally conductive than the layer 501 of the flexible circuit 406 is.

It is noted that the regions 510 do not actually have any functionality in the end usage of the inkjet printhead 400, and thus of the inkjet printing device in which the printhead 400 is inserted, to eject ink. Rather, the regions 510 are present to improve attachment of the flexible circuit 406 to the housing 402 of the inkjet printhead 400. More generally, the regions 510 do not actually have any functionality in the end usage of a fluid-jet precision-dispensing device to precisely dispense fluid therefrom.

In one embodiment, the regions 510 are fabricated from the same conductive material from which the traces 506 and the contacts 508 are fabricated, to render the fabrication process of the flexible circuit 406 easier. In this embodiment, the regions 510 are, however, electrically isolated from the traces 506 and the contacts 508. That is, while the regions 510 may themselves by electrically conductive, they do not function to actually transfer power and/or signals between the inkjet printhead 400 and the inkjet printing device in which the printhead 400 has been inserted, in contradistinction to the traces 506 and the contacts 508. In this embodiment, the regions 510 may further be electrically isolated from one another, in addition to being electrically isolated from the traces 506 and the contacts 508.

The regions 510 may further be rectangular in shape and at least substantially parallel to one another along their long side. The regions 510 may further be at least substantially parallel to the edge 411 of the housing 402 at which the surfaces 408 and 410 of the housing 402 meet. Having the regions 510 least substantially parallel to one another along their long sides and at least substantially parallel to the edge 411 of the housing 402 at which the surfaces 408 and 410 of the housing 402 meet is advantageous. In particular, should any of the regions 510 be located on the part of the flexible circuit 406 that bends at or near the edge 411 as the circuit 406 extends from the surface 408 to the surface 410 of the housing 410 as depicted in FIG. 4, such the regions 510 are less likely to mechanically militate against such bending of the circuit 406. That is, if the regions 510 were at least substantially parallel to one another along their long sides but at least substantially perpendicular to the edge 411, any of the regions located on the part of the flexible circuit 406 that bends at or near the edge 411 may mechanically prevent the circuit 406 from bending as smoothly. Those of ordinary skill within the art can appreciate, however, that the regions 510 may be other than rectangular in shape, and other than substantially parallel to one another and/or to the edge 411.

Figure 5B:
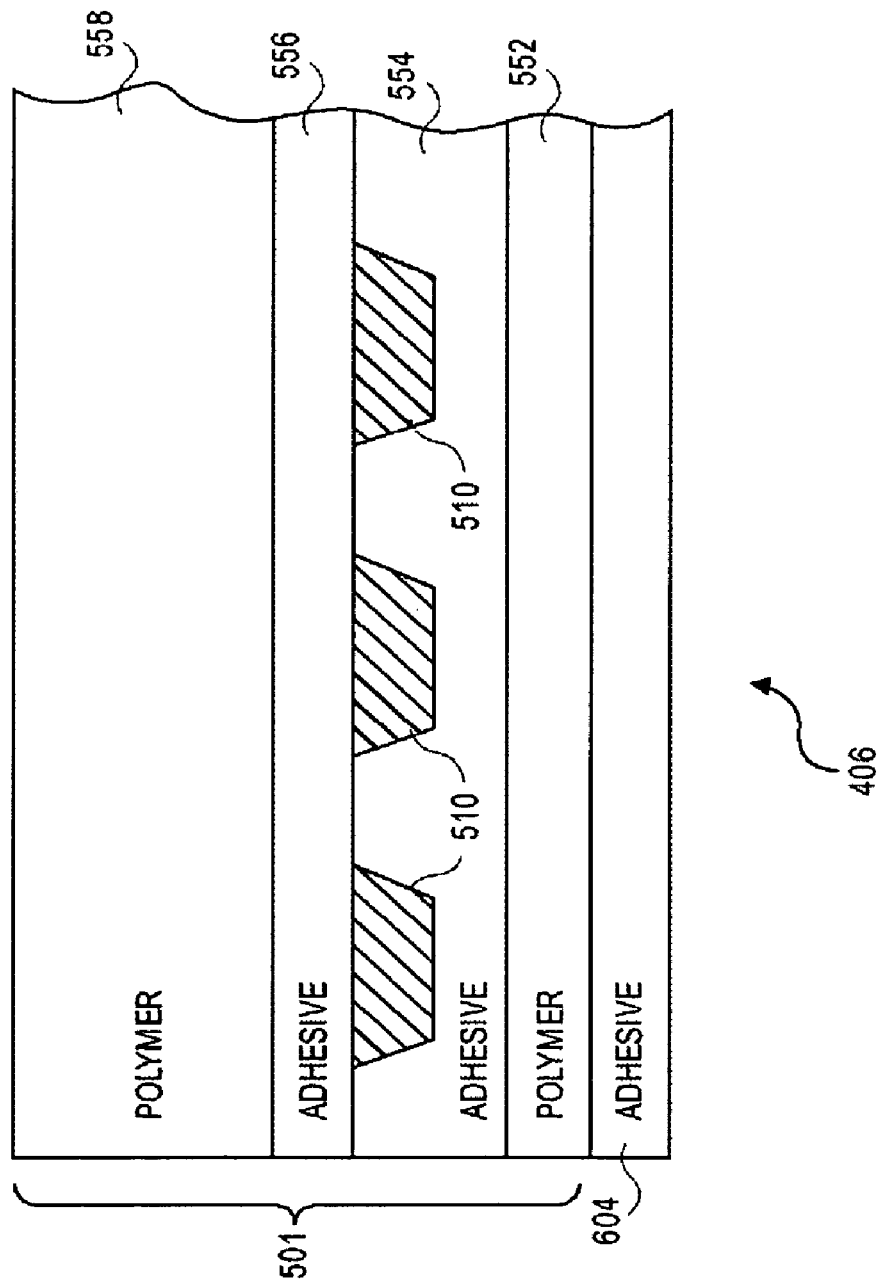
FIG. 5B is a cross-sectional diagram of the flexible circuit of FIG. 5A, according to an embodiment of the present disclosure.

FIG. 5B shows a cross-section of a portion of the flexible circuit 406 in detail, according to an embodiment of the present disclosure. In particular, the layer 501 is shown in more detail in FIG. 5B. The layer 501 includes a first polymer layer 552 and a second polymer layer 558, both of which may be polyimide or another type of polymer. Between the polymer layers 552 and 558 are two adhesive layers 554 and 556, both of which may be polyimide adhesives or another type of adhesive. The regions 510 that have been described are disposed within the adhesive layer 554. Furthermore, a heat-sensitive layer 604 is disposed on the bottom of the flexible circuit 406. The heat-sensitive layer 604 is used to attach the flexible circuit 406 to the housing 402 of the printhead 400.

As has been noted, the regions 510 are adapted to improve attachment of the flexible circuit 406 to the housing 400, particularly the portion 414 of the flexible circuit 406 to the surface 410 of the housing 400. This is achieved in one or more of three different ways. First, the regions 510 can be adapted to increase heat conductivity through the flexible circuit 406 during attachment of the circuit 406 to the housing 400, by virtue of the regions 510 having a thermal conductivity greater than that of the layer 501. Second, the regions 510 can be adapted to increase mechanical interlocking of the flexible circuit 406 with the housing 400 during attachment of the circuit 406 to the housing 400, by virtue of the regions 510 being more rigid than the layer 501 is. Third, the regions 510 can be adapted to increase applied pressure transfer through the circuit 406 to the housing 400 during attachment of the circuit 406 to the housing 400, also by virtue of the regions 510 being more rigid than the layer 501 is. All three of these ways are now described in more detail.

Figure 6:
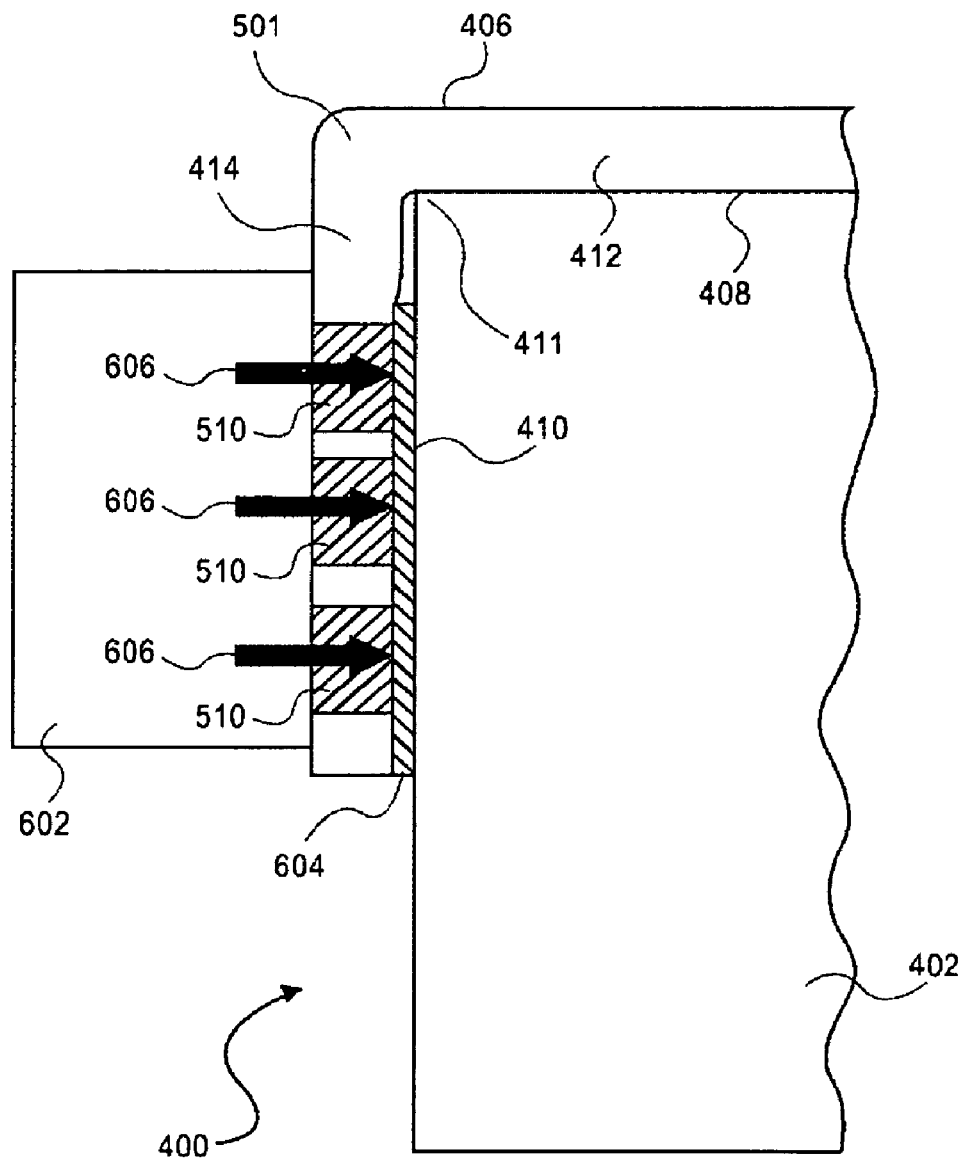
FIG. 6 is a diagram depicting how regions within the flexible circuit improve attachment of the flexible circuit to a housing of an inkjet printhead via improved heat conductivity, according to an embodiment of the present disclosure.

FIG. 6 shows how the regions 510 within the flexible circuit 406 improve attachment of the flexible circuit 406 to the housing 402 due to their having greater heat conductivity than the non-conductive layer 501 of the flexible circuit 406, according to an embodiment of the present disclosure. A side profile of a portion of the inkjet printing device printhead 400 is depicted in FIG. 6. The surfaces 408 and 410, as well as the edge 411, of the housing 402 are shown in FIG. 6. Also shown in FIG. 6 are the portions 412 and 414 of the flexible circuit 406. It is noted that for illustrative convenience, the regions 510 are depicted as extending completely through the layer 501 in FIG. 6. However, in actuality the regions 510 are sandwiched within the layer 501 as has been described in relation to FIG. 5B.

The portion 414 of the flexible circuit 406 is attached to the surface 410 of the housing 402 via the heat-sensitive adhesive layer 604 that is applied to the circuit 406 before the circuit 406 is positioned in relation to the housing 402 for attachment to the housing 402. The heat-sensitive adhesive of the layer 604 may be ethyl vinyl acetate (EVA), or another type of heat-sensitive adhesive. The layer 604 itself may in actually have a number of layers, such as two layers of heat-sensitive adhesive between which a layer of polyester is disposed, for instance. Once the flexible circuit 406 is properly positioned in relation to the housing 402, as depicted in FIG. 6, a heated element 602 is pressed against the portion 414 of the flexible circuit 406.

Heat emanates from the heated element 602, as indicated by the arrows 606. The material from which the regions 510 are selected so that its heat conductivity is greater than the heat conductivity of the material from which the layer 501 is fabricated. As a result, the heat from the heated element 602 more quickly transfers through the flexible circuit 406 to heat and melt the adhesive layer 604. As a result, the adhesive layer 604 is more quickly and/or better activated due to the presence of the regions 510. In this way, the regions 510 improve attachment of the flexible circuit 406 to the housing 402.

Figure 7:
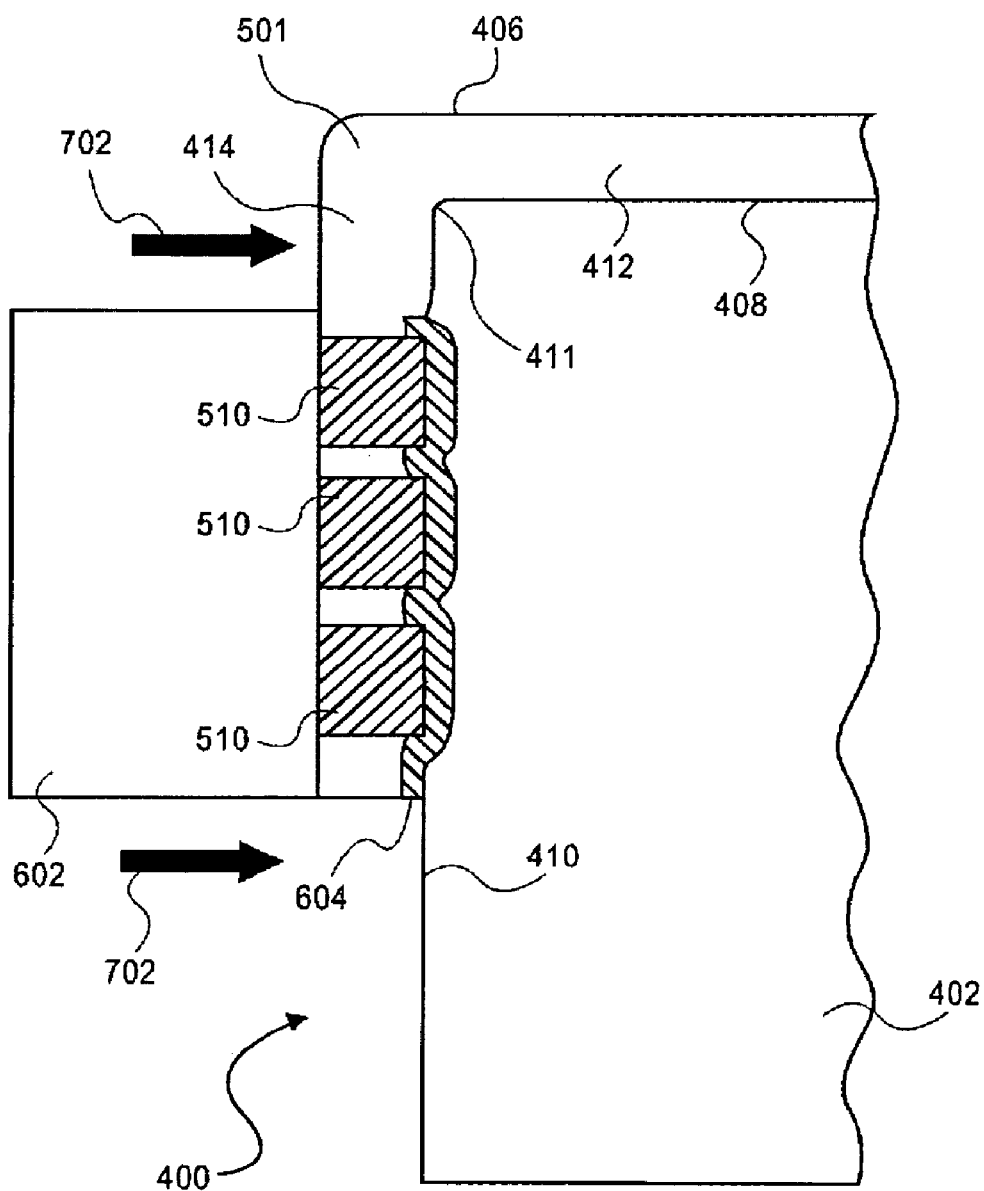
FIG. 7 is a diagram depicting how regions within the flexible circuit improve attachment of the flexible circuit to a housing of an inkjet printhead via improved mechanical interlocking and/or improved pressure transfer, according to an embodiment of the present disclosure.

FIG. 7 shows how the regions 510 within the flexible circuit 406 improve attachment of the flexible circuit 406 to the housing 402 due to their being harder and more rigid than the non-conductive layer 501 of the flexible circuit 406 is, according to an embodiment of the present disclosure. A side profile of a portion of the inkjet printing device printhead 400 is depicted in FIG. 7. The surfaces 408 and 410, as well as the edge 411, of the housing 402 are shown in FIG. 7. Also shown in FIG. 7 are the portions 412 and 414 of the flexible circuit 406. It is noted that for illustrative convenience, the regions 510 are depicted as extending completely through the layer 501 in FIG. 7. However, in actuality the regions 510 are sandwiched within the layer 501 as has been described in relation to FIG. 5B.

As has been described in relation to FIG. 6, the portion 414 of the flexible circuit 406 is attached to the surface 410 of the housing 402 via the heat-sensitive adhesive layer 604 applied to the circuit 406 being heated through the flexible circuit 406 via the heated element 602. The heated element 602 is pressed against the portion 414 of the flexible circuit 406 towards the surface 410 of the housing 402 with sufficient force, as indicated by the arrows 702, that the regions 510 mechanically interlock with the housing 402. That is, the regions 510 are literally pressed into the housing 402 by the pressure exerted by the heated element 602.

The material from which the regions 510 are fabricated is selected so that they are harder and more rigid than the material from which the layer 501 is fabricated is. As a result, the regions 510 provide for a better mechanical interlocking with the housing 402. This is because if the regions 510 were not present, the layer 501 would otherwise have insufficient hardness and rigidity to be pressed into the housing 402 to as great degree than when the regions 510 are present. That is, the layer 501 has more give than the regions 510 do, and pressure applied against the layer 501 results in the layer 501 compressing or expanding more than the layer 501 being pressed into the housing 402. Thus, the presence of the regions 510 allow the flexible circuit 406 to be attached to the housing 402 via better mechanical interlocking, in addition to being attached due to the adhesive layer 604.

Furthermore, the regions 510 provide for better and more uniform transfer of the pressure being applied by the heating element 602 against the flexible circuit 406 towards the housing 402. That is, the regions 510 provide for better transfer of this applied pressure through the flexible circuit 406 to the housing 402. Because the regions 510 are more rigid (i.e., mechanically harder) than the layer 501 of the flexible circuit 406 is, the regions 510 transfer this pressure to the housing 402 better, ensuring that the flexible circuit 406 is better pushed against the housing 402 than if the regions 510 were not present. By comparison, due to the layer 501 being flexible and less rigid than the regions 510 are, the layer 501 does not transfer pressure from the heating element 602 to the housing 402 as well as the regions 510 do. Rather, the layer 501 is more likely to absorb or redirect more of the pressure than the regions 510 do, instead of transferring the pressure to the housing 402. For instance, the layer 501 is likely to expanded or compress due to the applied pressure from the heating element 602, and in this way absorb or redirect the pressure instead of transferring the pressure to the housing 402.

Figure 8:
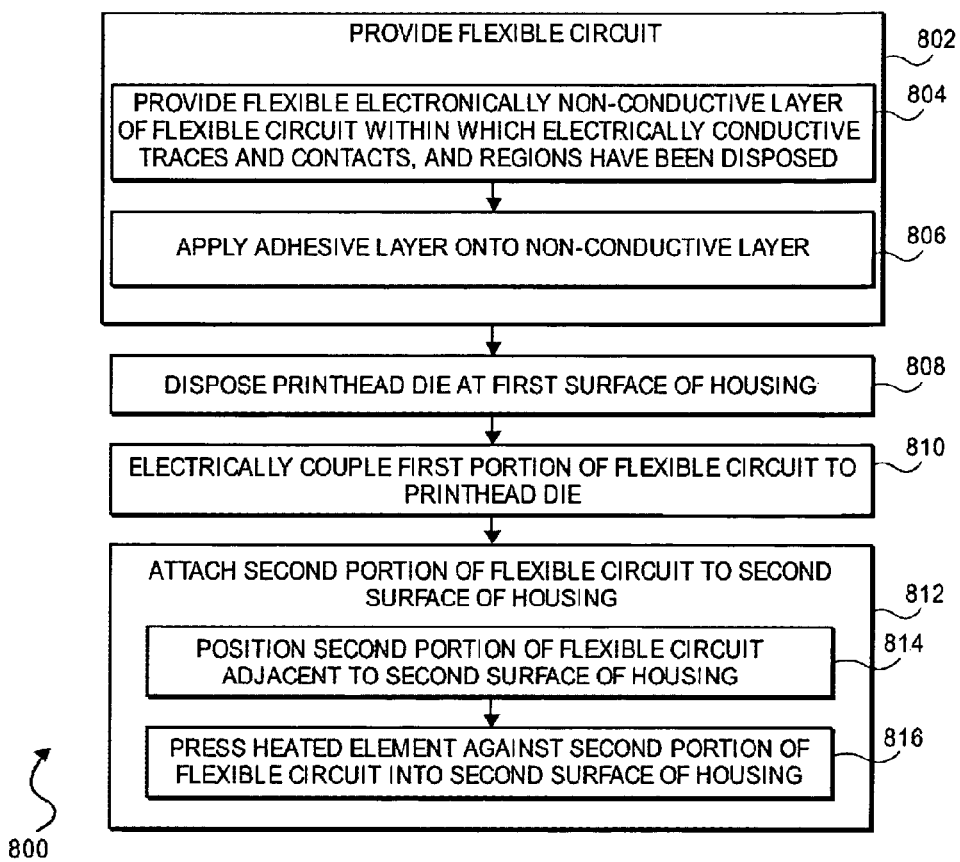
FIG. 8 is a flowchart of a method for at least partially fabricating an inkjet-printing device inkjet printhead, according to an embodiment of the present disclosure.

FIG. 8 shows a method 800 for at least partially fabricating the inkjet printhead 400 that has been described, according to an embodiment of the present disclosure. Those of ordinary skill within the art can appreciate that the method 800 can and typically will include other parts, in addition to and/or in lieu of those shown in FIG. 8. It is further noted that the order in which the parts of the method 800 are performed may vary than what is specifically shown in FIG. 8. For instance, part 810 may be performed prior to part 808 in one embodiment.

The flexible circuit 406 is initially provided or prepared (802). For instance, the flexible electrically non-conductive layer 501 is provided or prepared, within which the electrically conductive traces 506, contacts 508, and regions 510 are disposed (804). The traces 506, the contacts 508, and the regions 510 may be photolithographically fabricated within the layer 501. Thereafter, the heat-sensitive adhesive layer 604 is applied to or on the layer 501 (806). The printhead die 404 is then disposed at the first surface 408 of the housing 402 (808). The first portion 412 of the flexible circuit 406 is electrically coupled to the printhead die 404 at the first surface 408 (810). Next, the second portion 414 of the flexible circuit 406 is attached to the second surface 410 of the housing 402 (812).

For instance, the second portion 414 of the flexible circuit 406 may be positioned adjacent to the second surface 410 of the housing 402 (814). The heated element 602 may then be pressed against the second portion 414 of the flexible circuit 406 into the second surface 410 of the housing 402 (816). The heated element 602 in one embodiment can have a temperature of 280 degrees Celsius (+/−30 degrees Celsius), and be pressed against the flexible circuit 406 for approximately one-and-a-half seconds (+/−one second), at a pressure range of 30-100 pounds per square inch (PSI).

The presence of the regions 510 within the flexible circuit 604 improves attachment of the flexible circuit 406 to the second surface 410 of the housing 402, as has been described in relation to FIGS. 6 and 7. Furthermore, such improved attachment provides for process advantages. Without the regions 510, the tolerances within which the heating element 602 operates—i.e., its temperature, its applying pressure, and the length of time it is presented against the flexible circuit 406—have to be tightly controlled for the circuit 406 to properly attach to the housing 402, without damaging the flexible circuit 406.

For instance, if the temperature is too low and/or the length of application time is too short, then the flexible circuit 406 may not be properly attached to the housing 402. By comparison, if the temperature is too high, the length of application time is too long, and/or the pressure too great, then the flexible circuit 406 may become damaged. However, the presence of the regions 510 relaxes these tolerances to some extent, allowing for less precision in the process of attaching the flexible circuit 406 to the housing 402.

Figure 9:
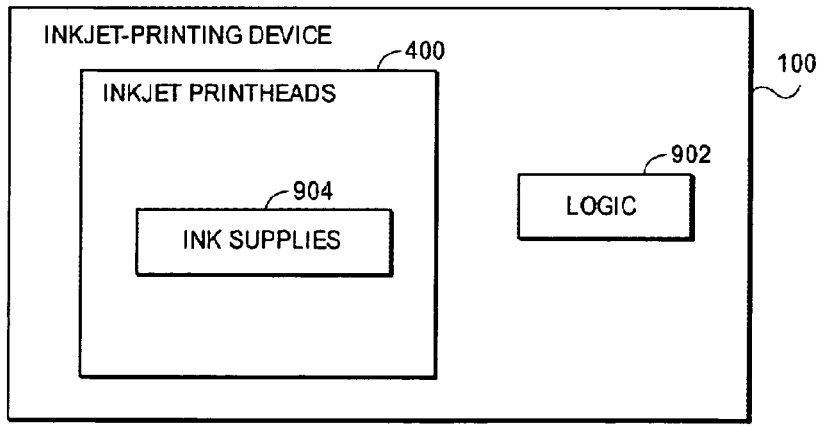
FIG. 9 is a rudimentary block diagram of an inkjet-printing device, according to an embodiment of the present disclosure.

In conclusion, FIG. 9 shows a block diagram of the inkjet-printing device 100, according to an embodiment of the present disclosure. As has been noted, the inkjet-printing device 100 is more generally a fluid-ejection device. The inkjet-printing device 100 is depicted in FIG. 10 as including one or more inkjet printheads 400 and logic 902. As can be appreciated by those of ordinary skill within the art, the inkjet-printing device 100 may include other components, in addition to and/or in lieu of those depicted in FIG. 9. For example, the inkjet-printing device 100 may include various motors, carriages, and so on, to properly move the inkjet printheads 400 and/or the media on which the printheads 400 form an image.

The inkjet printheads 400 are depicted as part of the inkjet-printing device 100 in FIG. 9 to denote that the inkjet-printing device 100 can include the inkjet printheads 400 that have been described. The inkjet printheads 400 are more generally inkjet-printing mechanisms, are most generally fluid-jet precision-dispensing mechanisms, and can also be referred to as inkjet printhead assemblies or fluid-jet precision-dispensing device cartridge assemblies. The inkjet printheads 400 can include integrated ink supplies 904 contained within the housings 604 of the printheads 400.

The logic 902 may be implemented in software, hardware, or a combination of software and hardware, and may be considered the means that performs various functionality. The logic 902 controls the inkjet printheads 400 to cause the inkjet printheads 400 to eject ink onto media in accordance with an image to be printed onto the media. In this respect, the logic 902 may, for instance, receive the image to be printed onto the media from a host computing device, such as a desktop or a laptop computer, a digital camera, or another type of device having computing capabilities.

We claim:

1. A fluid-jet precision-dispensing device cartridge assembly comprising:
 a housing having a first surface and a second surface, the second surface non-parallel to the first surface, the housing insertable in a fluid-jet precision-dispensing device;
 a fluid-jet precision-dispensing device die disposed at the first surface of the housing; and,
 a flexible circuit attached to the housing and wrapping around the housing from the first surface to the second surface,
 wherein the flexible circuit comprises:
  a plurality of electrically conductive traces and contacts electrically coupled to the die to transmit power and communicate signals between the device and the die; and,
  one or more regions having no functionality in usage of the assembly to precisely dispense fluid, the regions being one or more of rigid and thermally conductive to improve attachment of the flexible circuit to the housing.

2. The fluid-jet precision-dispensing device cartridge assembly of claim 1, wherein the regions of the flexible circuit are at least thermally conductive and are adapted to increase heat conductivity through the flexible circuit during attachment of the flexible circuit to the housing.

3. The fluid-jet precision-dispensing device cartridge assembly of claim 1, wherein the regions of the flexible circuit are at least rigid and are adapted to increase mechanical interlocking of the flexible circuit with the housing during attachment of the flexible circuit to the housing.

4. The fluid-jet precision-dispensing device cartridge assembly of claim 1, wherein the regions of the flexible circuit are at least rigid and are adapted to increase transfer of applied pressure through the flexible circuit to the housing during attachment of the flexible circuit to the housing.

5. The fluid-jet precision-dispensing device cartridge assembly of claim 1, wherein the regions of the flexible circuit are located at a portion of the flexible circuit that is attached to the second surface of the housing.

6. The fluid-jet precision-dispensing device cartridge assembly of claim 1, wherein the regions of the flexible circuit are fabricated from an electrically conductive material but are electrically isolated from the traces and the contacts.

7. The fluid-jet precision-dispensing device cartridge assembly of claim 6, wherein the regions are at least substantially parallel to one another.

8. The fluid-jet precision-dispensing device cartridge assembly of claim 6, wherein the regions are at least substantially parallel to an edge of the housing at which the first surface and the second surface of the housing meet.

9. The fluid-jet precision-dispensing device cartridge assembly of claim 6, wherein the regions comprise a plurality of rectangular regions.

10. The fluid-jet precision-dispensing device cartridge assembly of claim 1, further comprising a supply of fluid contained within the housing.

11. A flexible circuit for a fluid-jet precision-dispensing device cartridge assembly comprising:
 a flexible electrically non-conductive layer having a first portion and a second portion, the first portion corresponding to a first surface of a housing of the assembly and a second portion corresponding to a second surface of the housing, the second surface non-parallel to the first surface, the housing insertable in a fluid-jet precision-dispensing device;
 a plurality of electrically conductive traces and contacts disposed at the flexible electrically non-conductive layer to electrically couple to a fluid-jet precision-dispensing device die of the assembly at the first portion to transmit power and communicate signals between the device and the die; and,
 one or more regions having no functionality in usage of the device to precisely dispense fluid, the regions being one or more of rigid and thermally conductive to improve attachment of the flexible circuit to the housing.

12. The flexible circuit of claim 11, wherein the regions of the flexible circuit are adapted to improve attachment of the flexible circuit to the housing, by one or more of:
 increasing heat conductivity through the flexible circuit during attachment of the flexible circuit to the housing; and,
 increasing mechanical interlocking of the flexible circuit with the housing during attachment of the flexible circuit to the housing.

13. The flexible circuit of claim 11, wherein the regions of the flexible circuit comprise are fabricated from an electrically conductive material but are electrically isolated from the traces and the contacts.

14. A fluid-jet precision-dispensing device comprising:
 one or more fluid-jet precision-dispensing device cartridge assemblies, each assembly comprising:
  a housing having a first surface and a second surface, the second surface non-parallel to the first surface, the housing insertable in the device;
  a fluid-jet precision-dispensing device die disposed at the first surface of the housing; and,
  a flexible circuit attached to the housing and wrapping around the housing from the first surface to the second surface,
  wherein the flexible circuit comprises:
   a plurality of electrically conductive traces and contacts electrically coupled to the die to transmit power and communicate signals between the device and the die; and,
   one or more regions having no functionality in usage of the device to precisely dispense fluid, the regions being one or more of rigid and thermally conductive to improve attachment of the flexible circuit to the housing; and,
 logic to control the assemblies to cause the assemblies to precisely dispense fluid.

15. The fluid-jet precision-dispensing device of claim 14, wherein the regions of the flexible circuit are adapted to improve attachment of the flexible circuit to the housing, by being thermally conductive to increase heat conductivity through the flexible circuit during attachment of the flexible circuit to the housing.

16. The fluid-jet precision-dispensing device of claim 14, wherein the regions of the flexible circuit are adapted to improve attachment of the flexible circuit to the housing by being rigid to one or more of:

increase mechanical interlocking of the flexible circuit with the housing during attachment of the flexible circuit to the housing; and, increase transfer of applied pressure through the flexible circuit to the housing during attachment of the flexible circuit to the housing.

17. The fluid-jet precision-dispensing device of claim 14, wherein the regions of the flexible circuit comprise are fabricated from an electrically conductive material but are electrically isolated from the traces and the contacts.

18. A method comprising:

disposing a fluid-jet precision-dispensing die at a first surface of a housing of a fluid-jet precision-dispensing device cartridge assembly, the housing also having a second surface non-parallel to the first surface, the housing insertable in a fluid-jet precision-dispensing device;

electrically coupling a first portion of a flexible circuit to the die; and, attaching a second portion of the flexible circuit to the second surface of housing, wherein the flexible circuit comprises:

a plurality of electrically conductive traces and contacts electrically coupled to the die to transmit power and communicate signals between the device and the die; and, one or more regions having no functionality in usage of the device to precisely dispense fluid, the regions being one or more of rigid and thermally conductive to improve attachment of the flexible circuit to the housing.

19. The method of claim 18, wherein attaching the second portion of the flexible circuit to the second surface of the housing comprises:

positioning the second portion of the flexible circuit adjacent to the second surface of the housing; and, pressing a heated element against the second portion of the flexible circuit into the second surface of the housing, such that one or more of:

heat from the heated element melts an adhesive layer of the flexible circuit to affix the flexible circuit to the second surface of the housing, where the regions of the flexible circuit increase conductivity of the heat from the heated element to the adhesive layer;

pressure from the heated element mechanically interlocks the flexible circuit at the second surface of the housing, where the regions of the flexible circuit increase mechanical interlocking of the flexible circuit with the second surface of the housing;

the pressure from the heated element pushing the flexible circuit against the housing, where the regions of the flexible circuit increase transfer of the pressure through the flexible circuit to the housing.

20. The method of claim 18, wherein the regions of the flexible circuit comprise are fabricated from an electrically conductive material but are electrically isolated from the traces and the contacts.

* * * * *